United States Patent [19]
Worley

[11] Patent Number: 5,438,210
[45] Date of Patent: Aug. 1, 1995

[54] OPTICAL ISOLATION CONNECTIONS USING INTEGRATED CIRCUIT TECHNIQUES

[76] Inventor: Eugene R. Worley, 11 Bowditch, Irvine, Calif. 92720

[21] Appl. No.: 139,818

[22] Filed: Oct. 22, 1993

[51] Int. Cl.$^6$ .................. H01L 31/12; H01L 31/16
[52] U.S. Cl. ....................... 257/82; 257/83; 257/84; 257/99; 257/139; 257/818
[58] Field of Search ................ 257/81, 82, 83, 84, 257/99

[56] References Cited

U.S. PATENT DOCUMENTS

| | | | |
|---|---|---|---|
| 3,229,104 | 1/1966 | Rutz | 257/84 |
| 3,370,174 | 2/1968 | Toussaint | 257/82 |
| 4,933,561 | 6/1990 | Goransson et al. | 257/83 |

FOREIGN PATENT DOCUMENTS

| | | | |
|---|---|---|---|
| 57-104279 | 6/1982 | Japan | 257/84 |
| 60-82779 | 9/1985 | Japan | 257/84 |
| 60-257184 | 12/1985 | Japan | 257/84 |
| 61-48977 | 3/1986 | Japan | 257/66 |
| 3-191572 | 8/1991 | Japan | 257/81 |

*Primary Examiner*—Ngân V. Ngô
*Attorney, Agent, or Firm*—G. Donald Weber, Jr.

[57] ABSTRACT

Isolation circuits for optically passing signals between a plurality of electrical circuits without any electrically conductive path therebetween. The circuits utilize monolithic, silicon-on-insulator and integrated circuit techniques.

27 Claims, 2 Drawing Sheets

OPTICAL ISOLATION CONNECTIONS USING INTEGRATED CIRCUIT TECHNIQUES

BACKGROUND

1. Field of the Invention

This invention is directed to optical isolation circuits, in general, and to such circuits which are fabricated using integrated circuit techniques in conjunction with silicon-on-insulator materials, in particular.

2. Prior Art

Isolation circuits are used as a means of passing a signal between two circuits without any electrically conductive path connecting the two circuits together. The electrical isolation of two circuits may be necessary and/or desirable for a number of reasons. For example, there may be different and/or varying ground potentials between the circuits. Similarly, electrical noise present in one circuit could disturb the performance of the other circuit.

One commonly used method of signal isolation is to use a light beam to couple the signal from one circuit to another. Most optical isolator-couplers use GaAs based light emitting diodes(LEDs) and silicon based photodetectors to generate and receive the signals to be compiled.

Optical isolation circuits which use a GaAs LED and a silicon detector typically employ hybridization to make packaged opto-coupler units. That is, GaAs LEDs and silicon detectors are made in different fabrication lines because of the very different processing conditions and the different materials, such as dopants, utilized in each.

Silicon-On-Insulator (SOI) technology has emerged as a highly viable silicon technology for use in fabricating integrated circuits. SOI integrated circuits achieve component isolation via an intervening insulator rather than by back biased junctions as is the case with bulk silicon integrated circuits. Bonded wafers are one type of SOI technology which offer silicon films on $SiO_2$ substrate which have bulk silicon quality crystallinity. Other SOI technologies which offer slightly reduced crystallinity include Zone Melt Recrystallization (ZMR), SIMOX, and Silicon-On-Sapphire. Using any of these SOI materials, it is possible to realize a totally monolithic optical isolator if silicon can be made to emit enough light to be detected.

Since the 1950's, silicon diodes have been known to emit light. However, the quantum efficiency of such a light source ($2e^{-5}$ photons/carrier) is very low when compared to that of forward biased GaAs diodes. Not only are GaAs LEDs more efficient at emitting light, but the wavelength of light emitted by a GaAs diode is readily absorbed by silicon which makes silicon detectors efficient at detecting GaAs LED light. For these reasons and the fact that there was no SOI material with a high quality silicon film around at the time, the GaAs LED-silicon detector approach to optical couplers became widespread and has remained so since the 1960's.

In spite of the low quantum efficiency of silicon LEDs, it was demonstrated in 1965 that silicon could be used as an optical coupler. However, the object of that experiment was to show that light emission, and not carrier diffusion from a forward biased diode, was influencing the behavior of other diodes in the same piece of silicon. In fact, parasitic light emission from silicon devices and its effect on other devices in the same piece of silicon (i.e. increased junction leakage current) has been studied in depth.

For high speed communication between integrated circuit chips, it is desirable to use light instead of metal lines. At high signal speeds, metal lines suffer from transmission line effects and cross talk. For this reason, researchers have been trying to significantly increase the quantum efficiency of silicon light sources. For example, erbium has been used as a dopant to create optically active recombination centers in silicon. Unfortunately, these centers use effectiveness at room temperature. Other promising methods include porous silicon and carbon implanted in damaged silicon. For porous silicon, the energy of the photons emitted is above that of the silicon bandgap which means that a standard silicon PN junction diode can be used to detect the light. For the carbon implanted damaged silicon case the photon energy is below the bandgap energy of silicon.

PRIOR ART STATEMENT

The below listed references represent the best-known prior art. Where appropriate, certain of the teachings therein are incorporated herein by reference.

"Optoelectronics Data Book", Texas Instruments, Section 7, 1983–1984.

S. M. Sze, "Physics of Semiconductors", 2nd Edition, John , Wiley & Sons, pp. 699; 752–754; and 766–783, 1981.

J. Haynes and W. Westphal, "Radiation Resulting from Recombination of Holes and Electrons in Silicon", Physical Review, Vol. 101, No. 6, pp. 1676–1678, 1956.

Roland Haitz, "Studies on Optical Coupling Between Silicon p-n Junctions", Solid State Electronics, Vol 8, p 417–425, 1965.

S. Tam, C. Hu, "Hot-Electron Induced Photon and Photocarrier Generation in Silicon MSOFETs", IEEE Transaction on Electron Devices, Vol. 31, No. 9, pp. 1264–1273, September 1984.

T. Tsuchiya and S. Nakajima, "Emission Mechanism and Bias-Dependent Emission Efficiency of Photons Induced by Drain Avalanche in Si MOSFETs", IEEE Transaction on Electron Devices, Vol. 32, No. 2, pp. 405–412, February 1985.

S. Jana and K. Chern, "Hot-Carrier-Induced Photovoltage in Silicon Bipolar Junction Transistors", Solid State Electronics, Vol. 34, p. 1387–1392, 1991.

J. Michel, et al., "Impurity Enhancement of the 1.54-un Er3++, Luminescence in Silicon" Journal of Applied Physics, Vol. 70, No. 5, pp. 2672–2678, September 1991.

F. Namavar, H. Maruska, and N. Kalkhoran, "Visible Electroluminescence from Porous NP Heterojunction Diodes", Applied Physics Letters, Vol. 60, No. 20, May 1992.

V. Petrova-Koch, et al., "Rapid-Thermal-Oxidized Si—The Superior Photoluminescent Si", Applied Physics Letters, Vol. 61, No. 8, August 1992.

L. Canham, K. Barraclough, and D. Robbing, "1.3 $\mu$m Light-Emitting Diode from Silicon Electron Irradiated at its Damage Threshold", Applied Physics Letters, Vol. 51, No. 19, November 1987.

K. Konuma, et al., "A Stardard-Television Compatible 648×487 Picel Schottky-Barrier Infrared CCD Image Sensor", IEEE Transactions on Electron Devices, Vol. 39, No. 7, pp. 1633–1636, July 1992.

H. Elabd, T. Villani, and W. Kosonocky, "Palladium-Silicide Schottky-Barrier IR-CCD for SWIR Applications at Intermediate Temperatures", IEEE Electron Device Letters, Vol. 3, No. 4, pp. 89–90, September 1992.

P. Schmid, "Optical Absorption in Heavily Doped Silicon", Physical Review B, Vol. 23, No. 10, pp. 5531–5536, May 1981.

K. Misiakos, J. Park, and A. Neugroschel, "Carrier Lifetimes in Highly Injected Silicon", Journal of Applied Physics, Vol. 67, No. 5, pp. 2667–2582, March 1990.

A. Abidi, et al., "Uniformity in Flicker Noise Characteristics of CMOS IC Technologies", 9th International Conference on Noise in Physical Systems, Montreal, May 1987.

SUMMARY OF THE INSTANT INVENTION

This invention relates to a monolithic optical isolator circuit which utilizes silicon-on-insulator and integrated circuit techniques. The isolator circuit is especially useful in relatively low frequency applications such as, but not limited to, modems or telephone usages.

It is the object of this invention to show that there exist useful applications for low efficiency light emitting silicon diodes when applied to SOI technology rather than focusing on high speed interchip light communications as is the current stated research objective in boosting the light emission efficiency of silicon.

It can be shown that low speed optical couplers on SOI can be used as low cost digital isolation devices and, more importantly, as telephone and modem isolation devices. Any equipment which connects to the telephone line and requires power external to the telephone line such as speaker phones, cordless phones, facsimile machines and computer modems requires an isolation device. Telephone line transformers are commonly used at present to isolate externally powered circuitry from the telephone line.

Since the telephone transmission frequency extends from only about 300 Hz to 3000 Hz and the line isolation voltage requirement is 1600 V, an all monolithic SOI telephone line coupler is feasible. Furthermore, the new PCMCIA form factor standard for plug-in cards for portable personal computers dictates a height limitation that is too small for conventional telephone line transformers in the case of modems. The height specification of this standard is intended to accommodate a thin printed circuit card and thin silicon chips. An SOI optical coupler as envisioned here could readily accommodate the PCMCIA height standard.

There are three basic light emitters associated with silicon with respect to emission spectrum. A standard forward biased silicon PN junction emits light photons whose energy corresponds to the band gap of silicon, i.e. 1.1 eV, while porous silicon emits light at energies well above 1.1 eV and carbon implanted silicon emits light below 1.1 eV. At a photon energy of 1.1 eV or less, intrinsic silicon is not a good absorber of light. However, there are two ways in which silicon can be made to detect photons at 1.1 eV. One is to use Schottky barrier diodes which are able to detect photons at the band gap energy of silicon with a quantum efficiency of about 10%. (Schottky barrier diodes can also detect light whose photon energy is below 1.1 eV with reduced quantum efficiency.) Another is to use a diode which uses conventional silicon doping techniques to narrow the bandgap.

DESCRIPTION OF A PREFERRED EMBODIMENT

Figure 1:
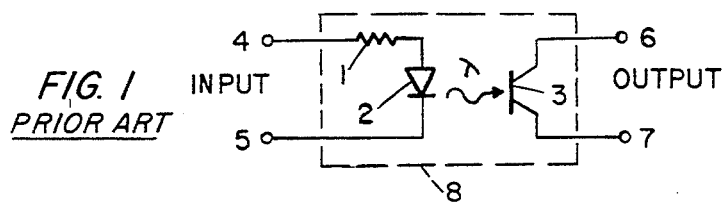
FIG. 1 is a schematic diagram of an optical coupler known in the prior art.

Referring now to FIG. 1, there is shown one example of an optical isolator circuit 8 which is known in the art. This circuit is used to transmit a digital bit from the input to the output while keeping the input terminals 4 and 5 electrically isolated from the output terminals 6 and 7. In operation, voltage is applied between input terminals 4 and 5 such that a current passes through LED 2 causing it to emit light. Resistor 1 is used to limit current flow into the LED. The light from LED 2 illuminates the silicon detector 3 which, in this case, is a floating-base NPN bipolar transistor. The illumination of the base region of the bipolar transistor produces a photo-generated base current. The base current causes the transistor to conduct current from the collector to the emitter thereof to establish a conducting path between output terminals 6 and 7. Conversely, of course, when no voltage is applied to input terminals 4 and 5, the LED 2 does not illuminate the bipolar transistor 3 which remains in the non-conducting state.

Figure 2:
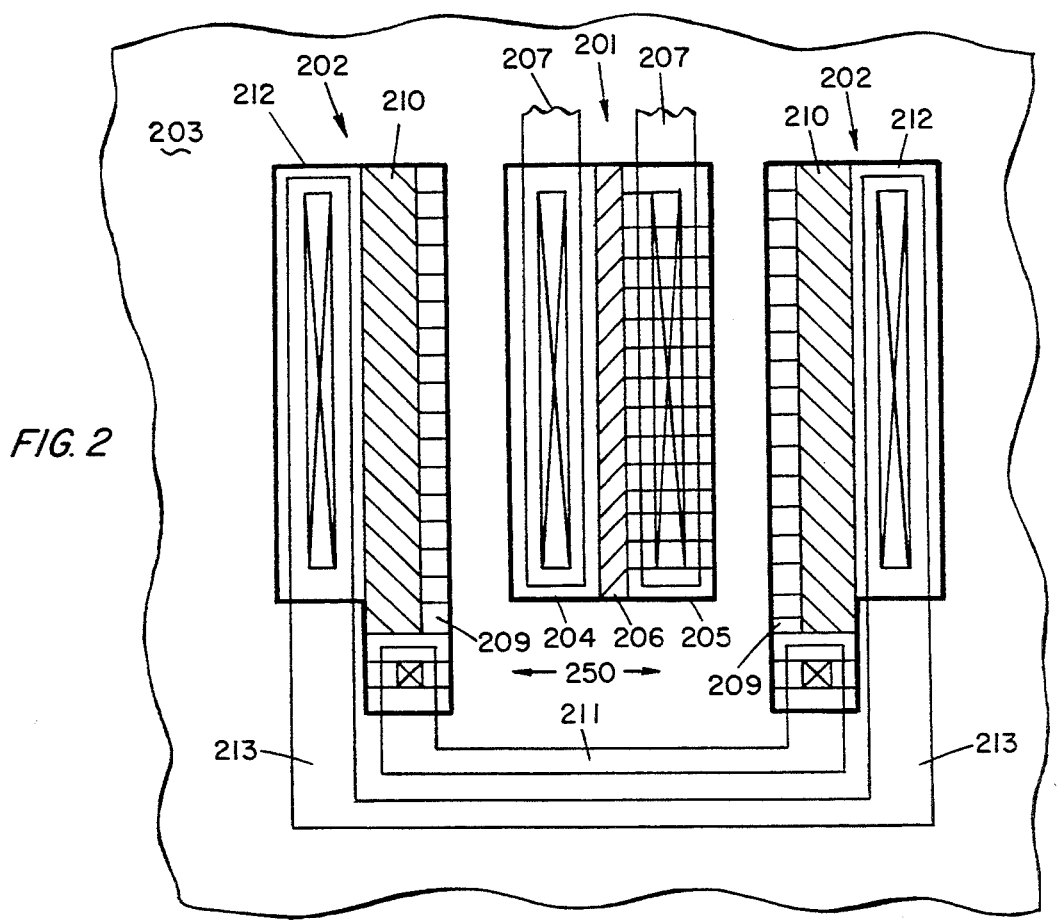
FIGS. 2 and 2A are plan and elevational views, respectively, of the integrated circuit of the instant invention.
Figure 2A:
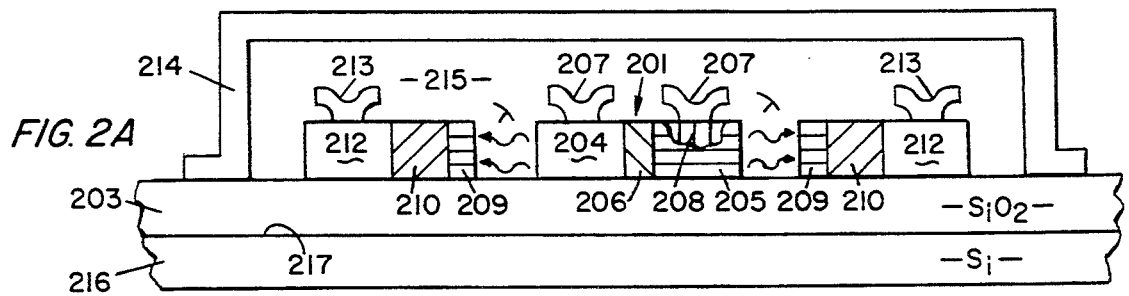

Referring concurrently now to FIGS. 2 and 2A, there are shown plan and elevational views, respectively, of one embodiment of the instant invention. FIGS. 2 and 2A represent integrated circuits of a narrow bandgap silicon detector along with a conventional silicon diode used as a light source. The silicon LED 201 is placed in the center of the light detector unit 250 which includes a pair of substantially identical detector diodes 202. The separation between the LED 201 and the detector diodes 202 is determined by the desired isolation voltage that can be tolerated. Another factor that determines the maximum isolation voltage is the thickness of the SOI material insulator layer 203. It is advantageous to make the resistivity of the silicon substrate 216 as high as possible. Thus, the substrate 216 is semi-insulating which aids in insulating the LED 201 from the detector diodes 202.

In this embodiment, the LED 201 consists of the relatively heavily doped P+ region 204 and N+ region 205. A lightly doped center region 206 can be either N− or P−.

The P+ region 204 and the N+ region 205 are doped as heavily as possible to minimize parasitic resistance without causing light absorption at a photon energy of 1.1 eV. To accomplish this effect, the N+ and P+ doping concentrations must be equal to or less than $3e18/c\mu\text{-cm}$.

The center region 206 is doped to about $1E16/c\mu\text{-cm}$ and can be either N type or P type. Moreover, the length of the center region 206 is several times longer than the junction depletion width thereof.

Interconnect 207 (typically, aluminum) is used to contact the regions 204 and 205 of the diode 201. Because aluminum tends to form a Schottky barrier diode for an N+ doping concentration of 3e18/cμ-cm, a very heavily doped region 208 is provided in region 205 just under the contact 207. For bonded silicon wafers, a silicon film thickness of about 2 um for the regions 204, 205 and 206 would be appropriate.

Each detector diode 202 consists of an N+ region 209, an N+P+ region 210 and a P+ region 212. The N+ region 209 is located adjacent to the LED 201. Thus, light must pass through region 209 to reach the N+P+ region 210 which is photosensitive. Since the N+ region 209 acts only as a means to electrically connect the photosensitive region 210 with the cathode terminal 211 of diode 202, it is made as narrow as possible. To prevent the absorption of 1.1 eV light, region 209 is doped to 3e18/cμ-cm or less. The resistance introduced by the N+ region 209 should be of little consequence because the diode 201 will be reverse biased and the photo-currents will be small. The P+ region 212 is used to connect the anode of diode 202 to the anode terminal 213.

As noted, the photosensitive region 210 consists of two dopants, N and P type, which are implanted at the same dose and range. The doping or impurity density is set for both dopants to be equal at about 1e19/cμ-cm. At this density, each dopant will narrow the bandgap of silicon by about 0.1 eV. Thus, a total narrowing of about 0.2 eV is achieved making region 210 able to absorb 1.1 eV light. The effective doping of region 210 with respect to carrier density is the difference between the N type and P type doping densities which can be on the order of 1% or less depending on the accuracy of the ion implanter. That is, the carrier density is less than 1e17 for this region. It is irrelevant whether this region is net N type or net P type because the diode junction can exist at the boundary of region 210 and either the N+ region or the P+ region.

Located above the LED-detector combination is an optional, second level of metal 214 or other light reflective material (see FIG. 2A) which reduces the amount of light escaping from the detector. Also, the light barrier 214 can significantly reduce cross talk to any additional adjacent LED-detector pairs which may be present on the same die. Typically, a thick, transparent SiO2 layer 215 is provided to electrically insulate the metal layer 214 from the components of the LED-detector pair. The silicon-SiO2 interface 216 located below the diodes can also act as a reflective surface to enhance operation of the device.

The detector diodes 202 are operated in the usual fashion by applying a reverse bias voltage and monitoring the current which will consist of a leakage or dark current and a photo signal current. The bias voltage is provided by a conventional network (not shown). Likewise, the current is monitored by a conventional amplifier (not shown) which will extract the photo signal.

For silicon LEDs, such as the porous silicon-type which emit light at energies above 1.1 eV, a conventional PN diode or a floating base bipolar transistor can be used as the detector 202. The detector diode can be operated in the reverse leakage mode or in the avalanche mode.

For silicon LEDs made of carbon implanted in damaged silicon which emit light below 1.1 eV, Schottky barrier diodes which are good infrared detectors can be used as the detector 202.

Figure 3:
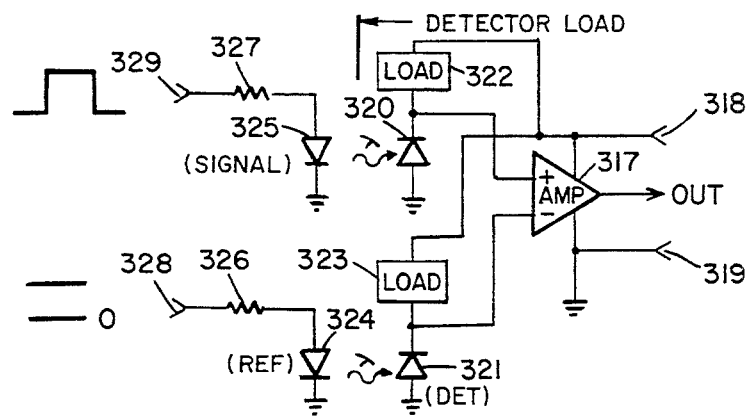
FIG. 3 is a schematic diagram of a low-light, digital optical coupler of the instant invention.

Referring now to FIG. 3, there is shown a schematic diagram of a low light level detector circuit suitable for a totally monolithic SOI optical coupler. Unlike the conventional GaAs LED-silicon detector optical coupler of FIG. 1, the circuit of FIG. 3 uses a powered operational amplifier 317 which functions as an analog comparator. Power to the comparator 317 is supplied on the detector side through terminals 318 and 319. Connected to the differential input terminals are the cathodes of photo detector diodes 320 and 321 and one side of the respective loads 322 and 323. The anodes of diodes 320 and 321 are connected to ground or other suitable reference voltage. The other sides of the loads 322 and 323 are connected to the common input terminal 318.

The comparator 317 requires that a reference level be established at the—terminal thereof which is half the level of a logic 1 signal. This is accomplished by providing a reference LED 324 and detector diode 321 which are identical to the signal LED 325 and detector diode 320. To generate a half level for the comparator, half of the logic 1 current associated with the signal LED 325 is applied to the reference LED 324. This is accomplished by using a current limiting resistor 326 whose value (2R) is twice the value (R) of the current limiting resistor 327 of signal LED 325. Thus, a logic 1 signal is always applied to the reference input terminal 328 during circuit operation. (It is assumed that the LEDs 325 and 326 have a linear light output response to input current.) Of course, additional bits can be added while using only one LED-detector pair as a reference.

The circuit of FIG. 3 was modelled using a computer circuit simulator. A high speed MOSFET comparator design was used for comparator 317. The input source to the comparator was assumed to be a photo-current with source resistance of 10 megohms. A channel length of 1.5 μm and an oxide thickness of 300 A were assumed. The other parameters were based on typical values found in a generic 1.5 μm CMOS process. Output load capacitance was assumed to be 100 pF and a power supply voltage of 5 V was used. It was also assumed that a logic 1 signal level produced a 4 nA photocurrent over a logic 0 level. Thus, the reference photo current was assumed to be one half the logic 1 value or 2 nA.

The simulation revealed that a digital frequency of about 400 KHz can be propagated through the optocoupler with a propagation delay of 0.7 μs. The quiescent power of the comparator 317 was only 3 mW. If 10 mA is input to the LED 325, then an LED-to-detector quantum efficiency as low as 4e-7 will produce the required 4 nA of photo current. (The light quantum efficiency of a standard silicon PN junction diode is 2e-5 with no optical recombination center enhancement. This leaves a minimum light gathering and detector quantum efficiency of 2% which is achievable.)

Figure 4:
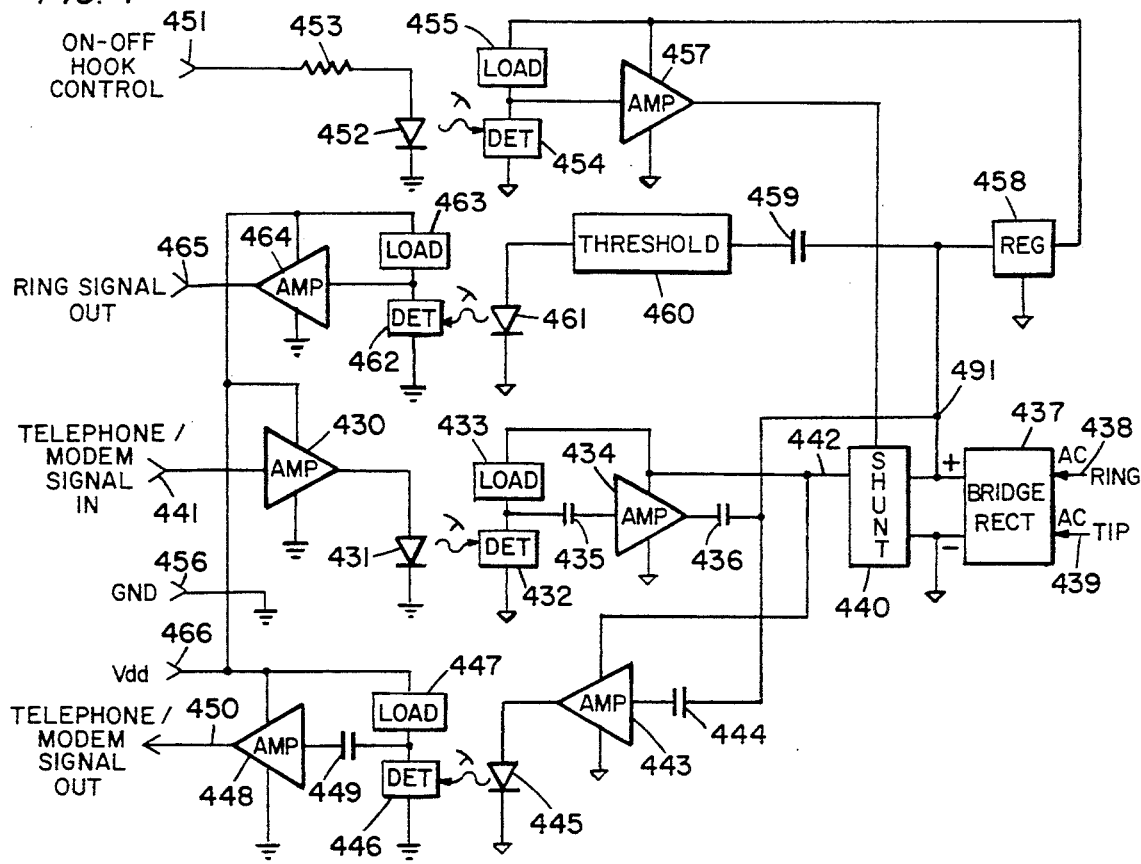
FIG. 4 is a schematic diagram of a monolithic silicon-on-insulator isolator for use with telephone and/or modem lines.

Referring now to FIG. 4, there is shown a schematic diagram of a monolithic SOI telephone line isolator. This telephone line isolator (i.e. optical coupler) can be realized using SOI material combined with conventional silicon integrated circuit processing, as described above. Such an isolator is suitable as either a general purpose telephone isolator or as a MODEM/FAX telephone line isolator. Amplifier 430 is a transconductance type device which receives the MODEM (or voice) input signal voltage at input terminal 441 and produces a signal current which is supplied to an LED 431. The light output of LED 431 is directed into a detector 432 which is nominally a reverse biased diode, as described above. Connected to the detector 432 is a load 433. The output of the detector 432/load 433 combination is fed to an amplifier 434 via a coupling capacitor 435. The output of the amplifier 434 is fed into the + terminal of the bridge rectifier 437. The telephone line "ring" and "tip" signals are applied to the AC terminals 438 and 439, respectively, of the bridge rectifier 437 in conventional fashion. The terminal of the bridge rectifier 437 is connected to ground. The bridge rectifier 437 is a standard feature of telephone line interface circuits is used to prevent the AC ring signal from coming into the coupler circuit. The signal applied to the + terminal of bridge rectifier 437 will be applied to the telephone line terminals 438 and 439 via bridge rectifier 437.

Power supply regulator 440 also receives the output of amplifier 434 at one input thereof. Another input of shunt 440 is connected to ground. The regulator 440 is a constant current shunt device which creates the "off-hook" condition by sinking the telephone line current from terminals 438 and 439. That is, at the signal frequency of the MODEM or telephone, there is no attenuation of the signal coming from amplifier 434 via capacitor 436 or the audio signal coming from 438 and 439 via 437. Regulator 440 produces a voltage at output terminal 442 which is used to power the telephone side of the optical coupler circuitry such as amplifier 434.

The input of transconductance amplifier 443 is connected to the phone line terminals 438 and 439 via bridge rectifier 437 and coupling capacitor 444. Amplifier 443 supplies the telephone or MODEM signal coming from the telephone line at terminal 491 into LED 445 for transmission to the MODEM or telephone. In particular, the light output from LED 445 is fed into detector 446 which is connected to detector load 447. The output of the light detector 446/load 447 combination is fed to amplifier 448 via coupling capacitor 449. The output of amplifier 449 is fed to the MODEM or telephone via terminal 450.

To initiate the off hook condition, the MODEM controller or telephone raises the voltage on control terminal 451 and applies a current to LED 452 via current limiting resistor 453. The light emitted from the off hook signaling LED 452 is supplied to light detector 454 which is connected to detector load 455. The output from the detector 454/load 455 combination is supplied to amplifier 457. The output of amplifier 457 selectively switches the power supply regulator 440 on and off. This action corresponds to the "off hook" and "on hook" conditions, respectively. Power for the on/off hook amplifier 457 is supplied by a special low current regulator 458. Regulator 458 and amplifier 457 are designed to consume microamps of current in the "on hook" state so that the central office does not register an "off hook" condition due to the current required to operate regulator 458 and amplifier 457.

Capacitor 459 couples the ring signal from the telephone line (via capacitor 436) to the rectifier/threshold circuit 460 to supply a current to LED 461 when the large amplitude AC ring signal is present. Light emitted from LED 461 is directed into detector 462 which is connected to load 463. The output from the detector 462/load 463 combination is supplied to amplifier 464 which creates a digital two state signal at terminal 465 to indicate whether or not a ring signal is present on the telephone line.

Power to operate amplifiers 430, 450, and 464 is provided at the Vdd terminal 466 and the ground terminal 456.

To determine the feasibility of transmitting a telephone frequency signal using an all-silicon optical isolator, an analysis was performed to determine what kind of signal levels would be required to be output from the light detector. Based upon reasonable assumptions, it was determined that a minimum signal amplitude photo-current required for a SNR of 23 db is 33 pA and the maximum photo-current set by SNR and the dynamic range is 5.0 nA. An average LED current of 5.0 mA is reasonable given that the telephone line can provide a minimum current of 20 mA. Thus, a minimum LED to detector quantum efficiency or coupling coefficient of about 1e-6 is required. This condition is readily achievable. The 3 db frequency for a typical amplifier circuit is 7.7 KHz, which is well within the maximum 3 KHz requirement for a telephone line. Thus, the circuit operation is attainable.

Figure 5:
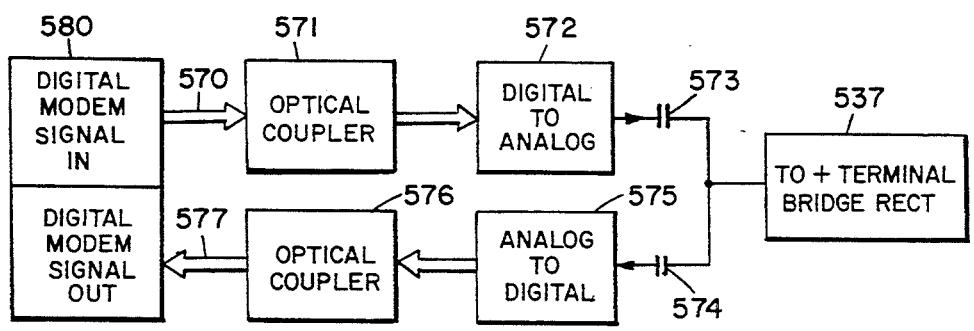
FIG. 5 is a schematic diagram of a digital version of a silicon-on-insulator modem isolator signal path.

Referring now to FIG. 5, there is shown a schematic diagram of one embodiment of a SOI MODEM isolator circuit. This circuit transmits digital data (rather than analog data) across the LED-detector barrier. Digital data generated by the MODEM controller 580 is fed into the LEDs of an optical coupler 571 on input line 570. Optical coupler 571 is similar to the coupler shown in FIG. 3.

The digital output signal from the coupler 571 is fed into a digital-to-analog converter 572. The analog output signal from converter 572 is fed to the + terminal of the bridge rectifier 537 via coupling capacitor 573. The rectifier 537 is similar to the bridge rectifier 437 shown and described relative to FIG. 4. The output "tip" and "ring" signals are supplied to rectifier 537 from the telephone lines as described above.

The MODEM signal coming from the telephone line via rectifier bridge 537 is fed into an analog-to-digital converter 575 via coupling capacitor 574. The output of the analog-to-digital converter 675 is supplied to the LEDs of optical coupler 576 which is similar to coupler 571. The digital output signal from coupler 576 is supplied to the MODEM controller 580 along output line 577. The bit transmission can be parallel, serial or a combination thereof depending upon the data rate required by the MODEM and the bit rate limit of each optical coupler bit.

The advantages of digitally transmitting data across the optical interface include higher achievable linearity, higher dynamic range, and better noise performance.

Thus, there is shown and described a unique design and concept of isolation circuits for optically passing signals between a plurality of circuits without any electrical path. The particular configuration shown and described herein relates to circuits which utilize monolithic, silicon-on-insulator and integrated circuit techniques. While this description is directed to a particular embodiment, it is understood that those skilled in the art may conceive modifications and/or variations to the specific embodiments shown and described herein. Any such modifications or variations which fall within the purview of this description are intended to be included therein as well. It is understood that the description herein is intended to be illustrative only and is not intended to be limitative. Rather, the scope of the invention described herein is limited only by the claims appended hereto.

I claim:

1. A monolithic SOI optical coupler comprising,
a silicon LED comprising a first region which is relatively heavily doped P+, a second region which is relatively heavily doped N+ and a third region of relatively lightly doped either N− or P− intermediate said first and second regions, and
light detector means comprising a first region doped N+, a second region doped P+ and a third region doped N+P+ intermediate said first and second regions,
a common support means,
said light detector means constructed adjacent to said LED on the same surface of said common support means,
said common support means includes an insulator layer.

2. The coupler recited in claim 1 wherein,
said common support means includes an intrinsic silicon substrate on which said insulator layer of $SiO_2$ is deposited in order to augment isolation between said LED and said light detector means.

3. The coupler recited in claim 1 wherein,
said light detector means comprises at least one of the group including a Schottky barrier diode, a standard PN diode, an avalanche diode and a floating base bipolar transistor.

4. The coupler recited in claim 1 including,
a light containment envelope comprised of a light reflective material.

5. The coupler recited in claim 4 wherein,
said reflective material is metal.

6. The coupler recited in claim 1 wherein,
said light detector means substantially surrounds said LED.

7. The coupler recited in claim 1 wherein,
said LED is constructed by a process which included implanting impurities into the silicon component to provide enhanced optical techniques.

8. The coupler recited in claim 1 including,
operational amplifier means connected to said detector means.

9. The coupler recited in claim 8 including,
control circuit means arranged to selectively interconnect said operational amplifier means with telephone signal circuits.

10. The coupler recited in claim 9 wherein,
said control circuit means includes,
bridge rectifier means connected to receive telephone signals and an output signal from said operational amplifier means.

11. The coupler recited in claim 10 wherein,
said telephone signals are the conventional "tip" and "ring" signals provided by conventional telephone systems.

12. The coupler recited in claim 10 wherein,
said control circuit means includes digital-to-analog converter means.

13. The coupler recited in claim 1 wherein,
said LED and said light detector means are mounted on the same surface of said common support means.

14. The coupler recited in claim 1 including,
a first set of interconnects contacting said first and second regions of said LED, and
a second set of interconnects contacting said light detector means.

15. The coupler recited in claim 1 wherein,
said light detector means is separated from said LED by a distance which is determined by the isolation voltage desired by said coupler.

16. The coupler recited in claim 1 wherein,
said light detector means comprises a narrow bandgap silicon detector.

17. The coupler recited in claim 1 wherein,
said light detector means includes a pair of substantially identical detector diodes spaced apart from said silicon LED.

18. The coupler recited in claim 1 wherein,
said common support means includes a layer of $SiO_2$ on which said light detector means and said silicon LED are disposed.

19. The coupler recited in claim 1 wherein,
said first and second regions are doped sufficiently heavily to minimize parasitic resistance therein without causing light absorption at photon energy of 1.1 eV.

20. The coupler recited in claim 14 wherein,
said interconnects are all formed of metal.

21. The coupler recited in claim 14 wherein,
one interconnect of said second set of interconnects is connected to said first region of said light detector means.

22. The coupler recited in claim 21 wherein,
said first region of said light detector means is disposed adjacent to said LED.

23. The coupler recited in claim 1 wherein,
said third region of said light detector means is doped P N in equal dosages.

24. The coupler recited in claim 4 including,
a layer of $SiO_2$ disposed over said silicon LED and said light detector means, and under said light containment envelope.

25. The coupler recited in claim 2 wherein,
the interface between said layer of $SiO_2$ and said intrinsic silicon substrate forms a light reflective surface to enhance the operation of said coupler.

26. The coupler recited in claim 8 including,
reference means for supplying a reference signal level connected to said operational amplifier means.

27. The coupler recited in claim 8 including,
digital signal input means connected to said silicon LED,
digit-to-analog converter means connected to the output of said operational amplifier means,
bridge rectifier means connected to the output of said digital-to-analog converter means,
analog-to-digital converter means connected to receive signals from said bridge rectifier means,
the output of said analog-to-digital converter means connected to said silicon LED of said coupler, and
output means connected to receive output signals from said light detection means of said coupler.

* * * * *